United States Patent [19]

Lin

[11] Patent Number: 6,107,154

[45] Date of Patent: Aug. 22, 2000

[54] METHOD OF FABRICATING A SEMICONDUCTOR EMBEDDED DYNAMIC RANDOM-ACCESS MEMORY DEVICE

[75] Inventor: Yung-Chang Lin, Feng-Yuan, Taiwan

[73] Assignee: United Microelectronics Corp., Hsinchu, Taiwan

[21] Appl. No.: 09/113,670

[22] Filed: Jul. 10, 1998

[30] Foreign Application Priority Data

May 12, 1998 [TW] Taiwan ................................. 87107281

[51] Int. Cl.⁷ ................................................. H01L 21/20
[52] U.S. Cl. .......................................... 438/396; 438/300
[58] Field of Search ................................... 438/253, 254,
438/255, 256, 396, 397, 398, 399, 585,
592, 482, 649, 682, 683, 655, 300

[56] References Cited

U.S. PATENT DOCUMENTS

| | | | |
|---|---|---|---|
| 5,902,125 | 9/1999 | Wu ........................................... | 438/300 |
| 5,937,300 | 8/1999 | Sekine et al. ........................... | 438/300 |
| 5,940,699 | 8/1999 | Sumi et al. .............................. | 438/300 |
| 5,946,578 | 8/1999 | Fujii ......................................... | 438/300 |
| 5,953,605 | 9/1999 | Kodama .................................. | 438/300 |
| 5,970,352 | 10/1999 | Shiozawa et al. ...................... | 438/300 |
| 5,994,191 | 9/1999 | Xiang et al. ............................. | 438/300 |

FOREIGN PATENT DOCUMENTS

| | | | |
|---|---|---|---|
| 3-46237 | 2/1991 | Japan .......................................... | 21/21 |
| 3-297148 | 12/1991 | Japan .......................................... | 21/21 |
| 5-67785 | 3/1993 | Japan .......................................... | 29/27 |
| 5-136415 | 6/1993 | Japan .......................................... | 29/21 |
| 6-252047 | 9/1994 | Japan .......................................... | 21/21 |
| 7-231091 | 8/1995 | Japan .......................................... | 29/21 |
| 8-70053 | 3/1996 | Japan .......................................... | 21/27 |
| 9-116113 | 5/1997 | Japan .......................................... | 27/21 |
| 9-298300 | 11/1997 | Japan .......................................... | 29/21 |
| 9-321304 | 12/1997 | Japan .......................................... | 29/21 |

*Primary Examiner*—David Nelms
*Assistant Examiner*—Dung A Le
*Attorney, Agent, or Firm*—Thomas, Kayden, Horstemeyer & Risley

[57] ABSTRACT

A semiconductor fabrication method is provided for the fabrication of an embedded DRAM (dynamic random-access memory) device. This method is also suitable for use in the fabrication of an embedded DRAM device with dual-gate CMOS (complementary metal-oxide semiconductor) structure. The method is characterized in that the titanium silicide layers in the embedded DRAM device are formed by first performing an SEG (selective epitaxial growth) process so as to form a plurality of amorphous silicon layers over the polysilicon gates and the source/drain regions of the various FET (field effect transistor) elements in the embedded DRAM device, and then performing a self-aligning silicide process on these amorphous silicon layers. This allows the titanium silicide layers to be isolated by the source/drain regions from the substrate. As a benefit of this, formation of the titanium silicide layers does not deplete part of the silicon atoms in the substrate as in the prior art, thus preventing a further thinning of the shallow junction that would cause leakage current in the DRAM device. Because the silicide layers of an embedded DRAM device with dual-gate CMOS structure are formed after the activation of the impurities in the source/drain regions, an embedded DRAM with a dual gate CMOS structure can prevent the occurrence of an inter-diffusion effect between the N-type polysilicon layer and the P-type polysilicon layer in the dual-gate CMOS structure.

18 Claims, 5 Drawing Sheets

METHOD OF FABRICATING A SEMICONDUCTOR EMBEDDED DYNAMIC RANDOM-ACCESS MEMORY DEVICE

CROSS-REFERENCE TO RELATED APPLICATION

This application claims the priority benefit of Taiwan application serial no. 87107281, filed May 12, 1998, the full disclosure of which is incorporated herein by reference.

BACKGROUND OF THE INVENTION

1. Field of the Invention

This invention relates to semiconductor fabrication technologies, and more particularly, to a method of fabricating an embedded DRAM (dynamic random-access memory) device which is a type of DRAM device that has a memory cell array and associated logic transistor array integrated on the same chip.

2. Description of Related Art

An embedded DRAM device is a type of DRAM device in which the memory cell array and the associated logic circuit array are integrated on the same chip. This design scheme allows the DRAM device to have very fast access speed, making the DRAM device useful in data processing systems that require high speed, such as image processing systems, where large amounts of data are processed. Fundamentally, an embedded DRAM device includes an array of logic circuit elements and an array of transfer FETs (field effect transistor), each of which is coupled to a capacitive element for charge storage. Each transfer FET serves as a switching element between the associated capacitive element and the bit line. Whether the data stored in the DRAM cell is 1 or 0 depends on whether or not electric charge is transferred via the transfer FET to the capacitive element where it is stored.

FIGS. 1A–1E are schematic sectional diagrams used to depict the steps involved in a conventional method of fabricating an embedded DRAM device. In FIGS. 1A–1E, only one DRAM cell is shown, and the right part of the wafer indicated by the reference numeral 170 shows the area where the transfer FET of the DRAM cell is formed, while the left part indicated by the reference numeral 172 shows the area where a logic circuit element in association with the DRAM cell is formed. In this embodiment, the logic circuit element is also an FET. Both the transfer FET 170 and the logic circuit element 172 are formed on the same substrate, which is a P-type silicon substrate 100, for example. A plurality of field oxide layers 102 are formed in the substrate 100 to serve as isolation areas isolating all the transfer FET 170 and the logic circuit element 172 from each other. These field oxide layers 102 can be formed either through a LOCOS (local oxidation of silicon) process or by first performing an STI (shallow trench isolation) process to form trenches in the substrate 100 and then performing a CVD (chemical-vapor deposition) process to deposit oxide into the trenches.

Figure 1A:
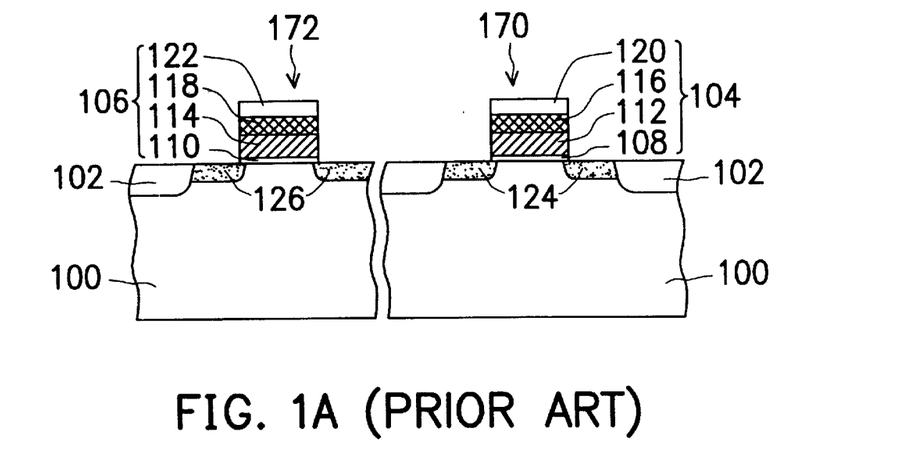
FIGS. 1A–1E are schematic sectional diagrams used to depict the steps involved in a conventional method for fabricating an embedded DRAM device.

In order to increase the conductivity of the gates of the FETs, conventional methodology forms a polysilicon layer and a metal silicide layer over the polysilicon layer to make a so-called polycide layer. The polycide layer is then selectively removed to form the desired gates. Another conventional method is to first deposit a polysilicon layer, then remove selected portions of the polysilicon layer, and then perform a self-aligning silicide process so as to form metal silicide layers respectively over the polysilicon layers and the source/drain regions. One drawback to the self-aligning silicide process, however, is that it can cause a further thinning of the shallow junction between the source/drain regions and the substrate, thus resulting in leakage current in the capacitive elements of the DRAM device that are coupled to the source/drain regions. Therefore, the self-aligning silicide process is not used to form metal silicide layers over the source/drain regions 124 in order to prevent leakage current. Furthermore, in order to increase the conductivity of the source/drain regions of those FETs in the logic circuit, a conventional method is to perform a self-aligning silicide process to form metal silicide layers over the source/drain regions 126.

Each transfer FET 170 includes a pair of source/drain regions 124 between which a channel is defined, a gate oxide layer 108 formed over the channel, a polysilicon layer 112 formed over the gate oxide layer 108, a layer of metal silicide 116 formed over the polysilicon layer 112, and a gate topping layer 120 formed over the metal silicide layer 116. The gate oxide layer 108, the polysilicon layer 112, the metal silicide layer 116, and the gate topping layer 120 in combination constitute a gate structure, as collectively indicated by the reference numeral 104. In a similar manner, each logic circuit element 172 includes a pair of source/drain regions 126 between which a channel is defined, a gate oxide layer 110 formed over the channel, a polysilicon layer 114 formed over the gate oxide layer 110, a layer of metal silicide 118 formed over the polysilicon layer 114, and a gate topping layer 122 formed over the metal silicide layer 118. The gate oxide layer 110, the polysilicon layer 114, the metal silicide layer 118, and the gate topping layer 122 in combination constitute a gate structure, as collectively indicated by the reference numeral 106.

Figure 1B:
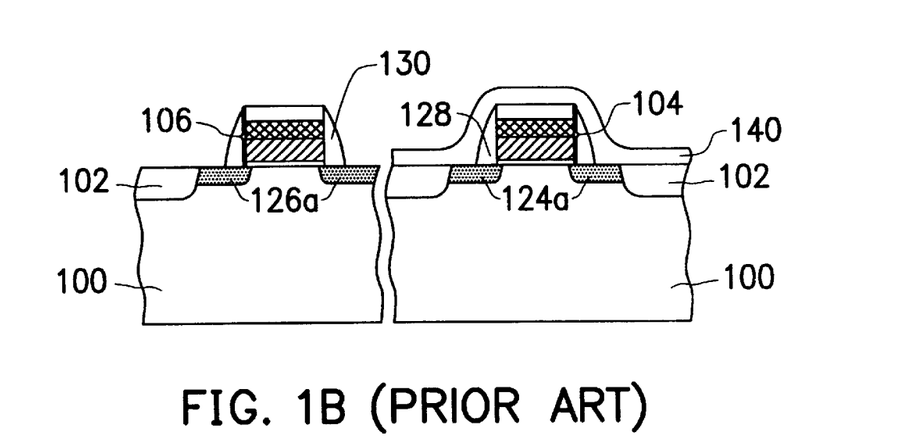
Figure 1C:
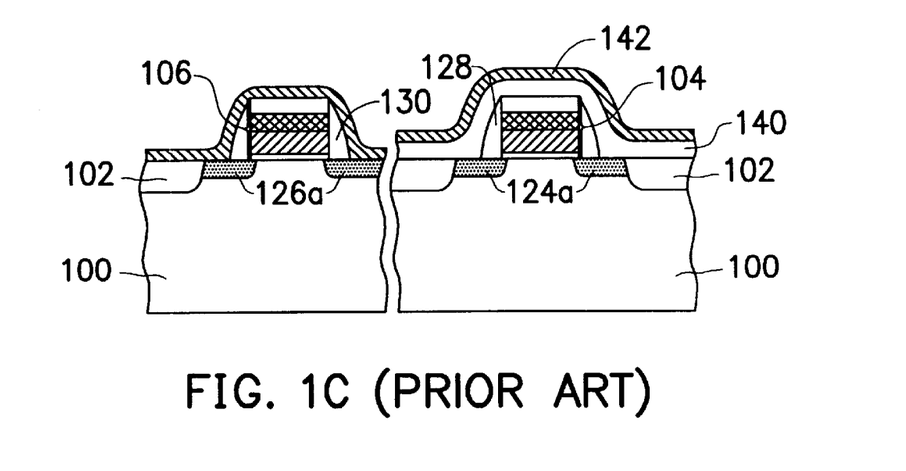

Referring next to FIG. 1B, an annealing process is performed on the wafer of FIG. 1A at a temperature of 900–1,000° C. This annealing process activates the doped impurities in the source/drain regions 124, 126 and thus more evenly distributes the impurities in the source/drain regions 124, 126 (hereinafter, the annealed source/drain regions are instead designated respectively by the reference numeral 124a, 126a in order to distinguish one from the other). Next, sidewall spacers 128, 130 are respectively formed on the sidewalls of the gate structures 104, 106. Subsequently, an insulating layer 140 is formed over the area 170 where the transfer FET is formed Referring further to FIG. 1C, in the subsequent step, a metal layer, such as a titanium layer 142, is formed through a PVD (physical vapor deposition) process over the entire top surface of the wafer.

Figure 1D:
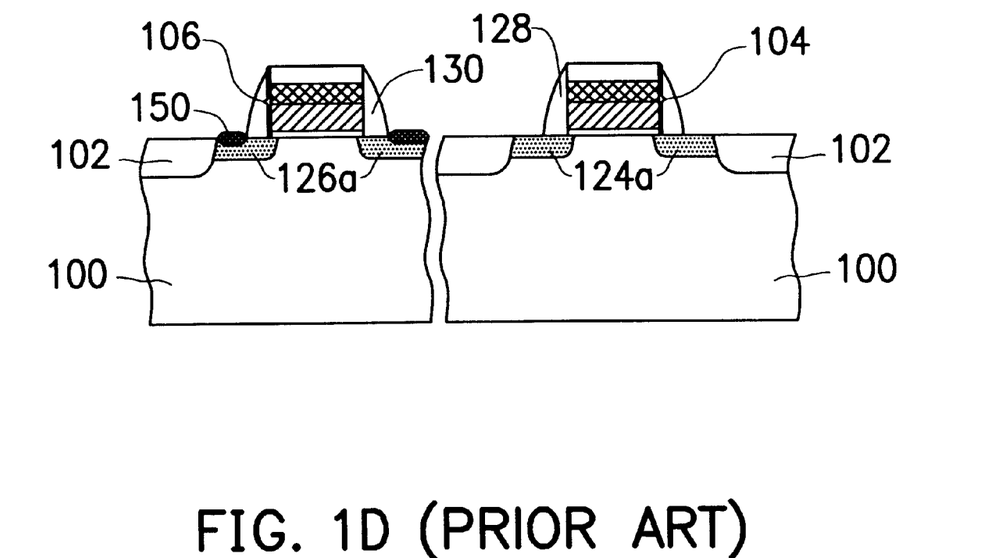

FIG. 1D shows the subsequent step, in which an annealing process is performed on the entire wafer at a temperature of 700–800° C. In this annealing process, part of the titanium layer 142 over the source/drain regions 126a is converted into silicide. Subsequently, a wet etching process is performed on the wafer by submerging the entire wafer in an aqueous solution of $H_2O_2$ and $NH_4OH$, in which the unreacted part of the titanium in the titanium layer 142 is removed. The remaining portions of the titanium silicide layer are here designated by the reference numeral 150. After this, another annealing process is performed on the wafer, whereby the titanium silicide layer 150 over the source/drain regions 126a can be reduced in electrical resistance. The foregoing process for forming this titanium silicide layer 150 is customarily referred to as a self-aligning silicide process.

Figure 1E:
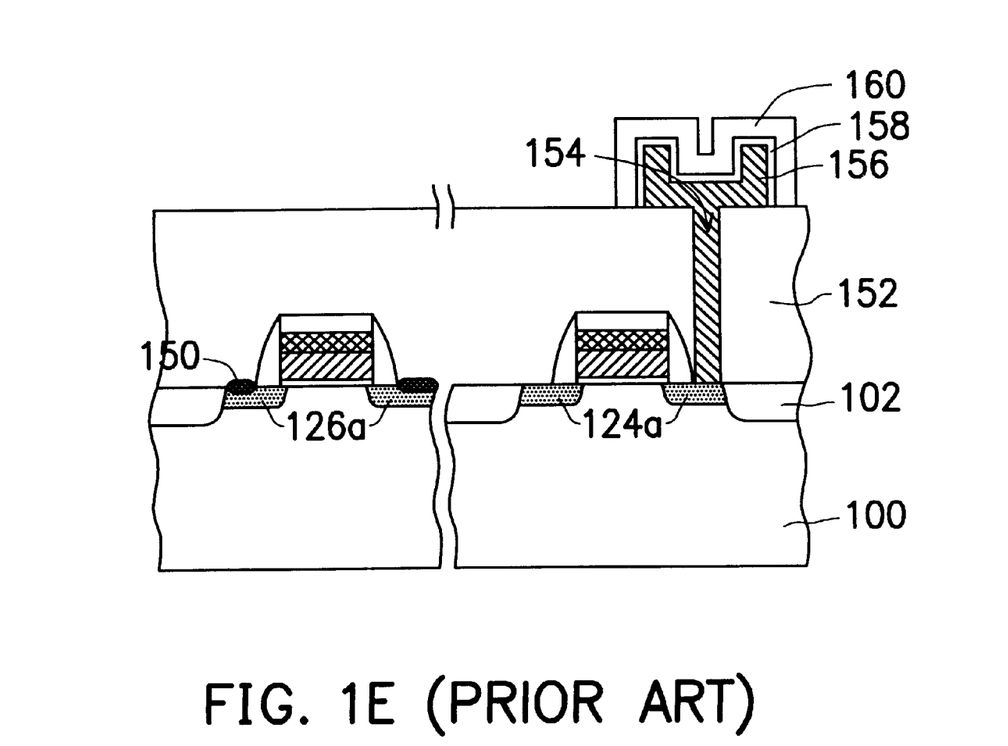

FIG. 1E shows the subsequent step, in which a thick dielectric layer 152 is formed over the entire top surface of the wafer. The dielectric layer 152 then is selectively removed to form a contact window 154 to expose one of the source/drain regions 124a of the transfer FET. Subsequently, a conventional process is performed to form a capacitive element including a first conductive layer 156, a dielectric layer 158, and a second conductive layer 160. The first conductive layer 156 comes into electrical contact with the exposed one of the source/drain regions 124a via the contact window 154. This completes the fabrication of the embedded DRAM device.

One drawback to the foregoing method, however, is that in the self-aligning silicide process for forming the titanium silicide layer 150, a certain amount of the silicon in the substrate 100 is depleted due to reaction with the titanium, which leads to a further thinning of the shallow P-N junction between the source/drain regions 126a and the substrate 100. A leakage current thus can occur at this thin shallow P-N junction. This thinning effect is particularly serious when the embedded DRAM device is further downsized for higher integration.

With high integration, a new type of CMOS (complementary metal-oxide semiconductor), called dual-gate CMOS structure, is used to replace old types of CMOS structures. A dual-gate CMOS structure refers to a semiconductor structure that includes both N-type and P-type MOS transistors on the same chip, where the NMOS transistor has an N-type highly doped polysilicon gate and the PMOS transistor has a P-type highly doped polysilicon gate. The dual-gate CMOS structure can be used in an embedded DRAM device to provide enhanced performance. A conventional method for fabricating an embedded DRAM device with dual-gate CMOS structure is depicted in the following with reference to FIG. 2.

Figure 2:
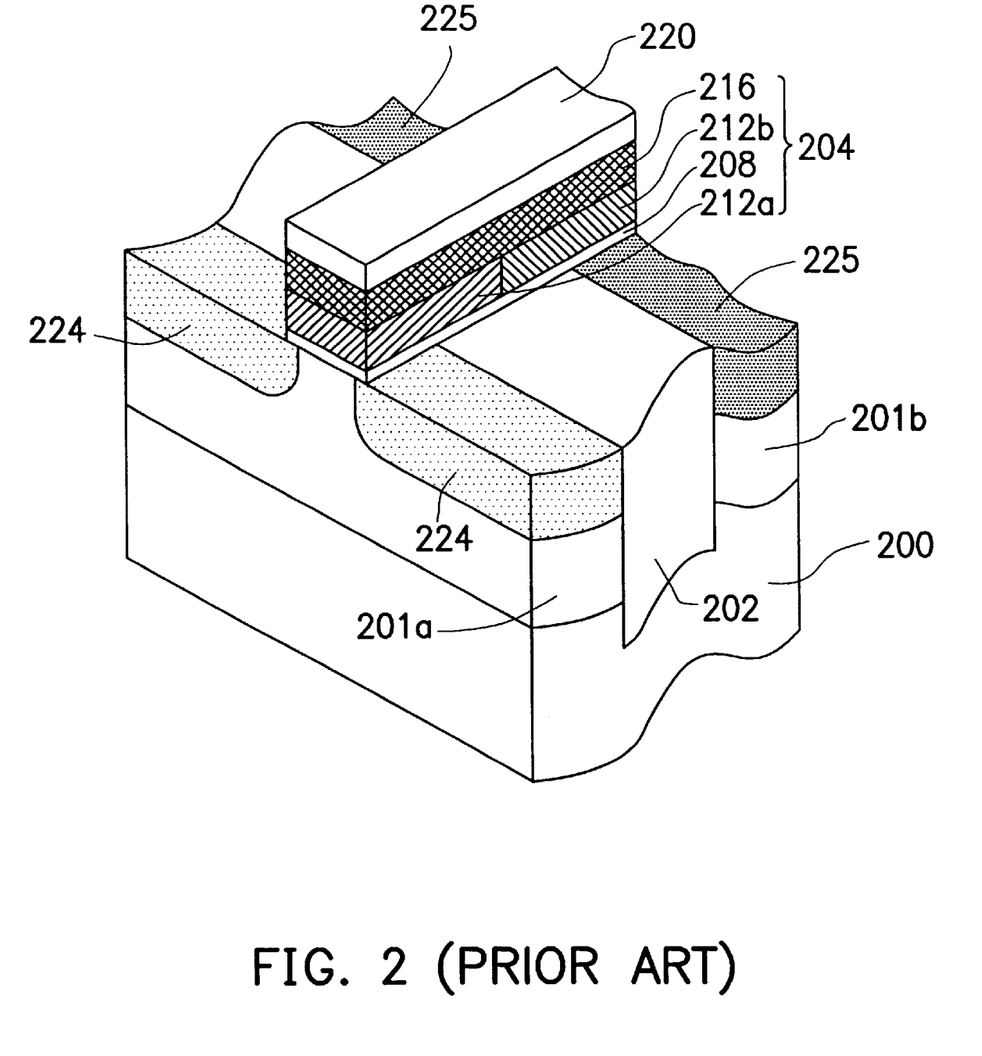
FIG. 2 is a schematic perspective diagram used to depict the initial steps involved in a conventional method for fabricating an embedded DRAM device with dual-gate CMOS structure.

FIG. 2 is a schematic perspective diagram used to depict the initial steps involved in a conventional method for fabricating an embedded DRAM device with dual-gate CMOS structure.

As shown, a substrate 200 is prepared, in which a P-well 201a, a N-well 201b, and an isolation area 202 are formed. Next, a gate structure 204 is formed, which includes a gate oxide layer 208, two juxtaposed polysilicon layers 212a, 212b over the gate oxide layer 208, a metal silicide layer 216 over the two polysilicon layers 212a, 212b, and a gate topping layer 220 over the metal silicide layer 216. By the dual-gate CMOS technology, the first polysilicon layer 212a is located above the P-well 201a and the isolation area 202 and is highly doped with an N-type impurity element, while the second polysilicon layer 212b is located above the N-well 201b and the isolation area 202 and is highly doped with a P-type impurity element. After the gate structure 204 is formed, a photolithographic and ion-implantation process is performed to define and form a first pair of source/drain regions 224 in association with the first polysilicon layer 212a (the N-type highly doped polysilicon layer) and a second pair of source/drain regions 225 in association with the second polysilicon layer 212b (the P-type highly doped polysilicon layer). Next, an annealing process is performed on the wafer at a temperature of 900–1,000° C. to activate the doped impurities in these source/drain regions 224, 225. The first polysilicon layer 212a and the source/drain regions 224 in combination constitute an NMOS transistor, while the second polysilicon layer 212b and the source/drain regions 225 in combination constitute a PMOS transistor.

The subsequent steps taken to complete the fabrication of this embedded DRAM device with dual-gate CMOS structure are the same as those depicted in reference to FIGS. 1B–1E, so detailed description of them is not be repeated.

One drawback to the foregoing method for fabricating an embedded DRAM device with dual-gate CMOS structure, however, is that the annealing process to activate the doped impurities in the source/drain regions 224, 225 also causes the N-type impurities in the first polysilicon layer 212a and the P-type impurities in the second polysilicon layer 212b to be subjected to an undesired inter-diffusion effect through the metal silicide layer 216. As a bad consequence of this, the first and second polysilicon layers 212a, 212b can suffer from a reduced impurity concentration, thus resulting in a drift in the threshold voltage of the resultant DRAM device.

SUMMARY OF THE INVENTION

It is therefore an objective of the present invention to provide a method for fabricating an embedded DRAM device, which can prevent the further thinning of the shallow P-N junction between the source/drain regions and the substrate from the self-aligning silicide process.

It is another objective of the present invention to provide a method for fabricating an embedded DRAM device with dual-gate CMOS structure, which can help prevent the undesired inter-diffusion effect as mentioned in the background section of this specification so as to protect the threshold voltage of the resultant DRAM device.

In accordance with the foregoing and other objectives of the present invention, a new method for fabricating an embedded DRAM device is provided. The method of the invention can also be used for the fabrication of an embedded DRAM device with dual-gate CMOS structure. The method of the invention includes the following procedural steps of:

(1) preparing a semiconductor substrate which is partitioned into a transfer FET area and a logic circuit area;

(2) forming a first FET in the transfer FET area, the first FET including one polysilicon gate and one pair of associated source/drain regions;

(3) forming a second FET in the logic circuit area, the second FET including one polysilicon gate and one pair of associated source/drain regions;

(4) forming sidewall spacers respectively on the sidewalls of the polysilicon gates of the first and second FETs;

(5) performing an SEG process so as to form a plurality of amorphous silicon layers respectively over the polysilicon gates and source/drain regions of the first and second FETs;

(6) forming a metal layer over the entire top surface of the wafer;

(7) performing an annealing process to allow the forming of a metal silicide layer from the reaction between the metal layer and each of the amorphous silicon layers;

(8) removing the unreacted part of the metal layer;

(9) forming a dielectric layer over the entire top surface of the wafer; and (10) forming a capacitive element over the dielectric layer, the capacitive element being electrically coupled to one of the source/drain regions of the first FET.

The method of the invention is characterized by the formation of the finished titanium silicide layers in the embedded DRAM device. First, a selective epitaxial growth (SEG) process is performed to form a plurality of amorphous silicon layers respectively over the polysilicon gates and the source/drain regions of the various FET (field effect transistor) elements in the embedded DRAM device. Second, a self-aligning silicide process is performed on these amorphous silicon layers. This allows the titanium silicide layers to be formed entirely over the source/drain regions and thus isolated from the substrate by the source/drain regions. As a benefit of this, the forming of the titanium silicide layers does not deplete part of the silicon atoms in the substrate as in the prior art, thus preventing the further thinning of the shallow junction that would otherwise occur in the embedded DRAM device fabricated by the prior art.

Moreover, the method of the invention also can be used to fabricate an embedded DRAM device with dual-gate CMOS structure. In this case, since the silicide layers are formed after the activation of the impurities in the source/drain regions, it can prevent inter-diffusion between the N-type polysilicon layer and the P-type polysilicon layer in the dual-gate CMOS structure.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 3A–3F are schematic sectional diagrams used to depict the steps involved in the method according to the invention for fabricating an embedded DRAM device.

Typically, a complete embedded DRAM device includes a memory cell array, a high-speed logic circuit in association with the memory cell array, and a switching circuit in association with the logic circuit. The operating voltage for the switching circuit is higher than that for the logic circuit. The switching circuit is required in the case that the internal operating voltage of the logic circuit is lower than the operating voltage of the external circuit of the DRAM device, or in the case that the logic circuit should be started by an electric current of a high magnitude, so as to allow the DRAM device to be operable by the high operating voltage. Since the provision and fabrication of the switching circuit is well known in the industry, it is not depicted in FIGS. 3A–3F and the following detailed description. Moreover, in FIGS. 3A–3F, only one DRAM cell is shown, in which the right part (as designated by the reference numeral 370 in FIG. 3A) is the area where the transfer FET of the DRAM cell is formed, and the left part (as designated by the reference numeral 372 in FIG. 3A) is the area where a logic circuit element (in this embodiment, an FET) in association with the DRAM cell is formed.

Figure 3A:
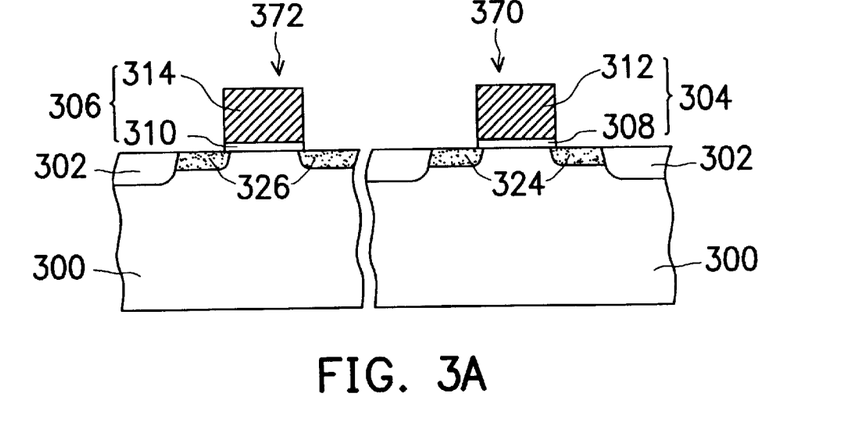
FIGS. 3A–3F are schematic sectional diagrams used to depict the steps involved in the method of the invention for fabricating an embedded DRAM device.

FIG. 3A shows the first step, in which a semiconductor substrate, such as a P-type silicon substrate 300 is prepared. Subsequently, a plurality of isolation areas 302 is formed either through a LOCOS process or by performing an STI and CVD process. These isolation areas 302 are used to isolate the FETs from each other. In practice, the initial steps also include various ion-implantation processes, such as field implantation, anti-punch through implantation, and the ion-implantation to form P-wells and N-well for CMOS structure. These processes involve conventional techniques and are not within the spirit and scope of the invention, so description of it is not be further detailed.

In the fabrication of the embedded DRAM device, various kinds of FETs are formed respectively for the DRAM cell, the logic circuit element, and the switching circuit. These FETs can be different in I/O and leakage current characteristics. For example, the FETs for the logic circuit are designed in such a manner as to provide high-speed and low-power characteristics, the FETs for the DRAM cells are designed to provide a low leakage current, and the FETs for the switching circuit are designed to have a high operating voltage and a high trigger current. These different characteristics can be provided by conventional semiconductor fabrication processes and are not within the spirit and scope of the invention, so description of them is not further detailed.

A first gate structure 304 and a second gate structure 306 are formed over the substrate 300 of FIG. 3A. First gate structure 304 is formed at a selected location in the transfer FET area 370, and second gate structure 306 is formed at a selected location in the logic circuit area 372. The first gate structure 304 includes one gate oxide layer 308 and one polysilicon layer 312. Similarly, the second gate structure 306 includes one gate oxide layer 310 and one polysilicon layer 314. The first gate structures 304, 306 can be formed, for example, by first performing a thermal oxidation process to form an oxide layer over the entire top surface of the wafer, then performing a CVD process to deposit a polysilicon layer over the entire top surface of the oxide layer, and finally performing a selective removal process to remove unwanted portions of the oxide layer and the polysilicon layer. The remaining portions of the oxide layer and the polysilicon layer are then the above-mentioned gate oxide layers 308, 310 and the polysilicon layers 312, 314.

Subsequently, an ion-implantation process is performed on the wafer so as to dope an impurity element into those areas in the substrate 300 that are uncovered by the first gate structure 304 and the second gate structure 306 (because the polysilicon layers 312, 314 are impenetrable by the dopant). As a result of this process, a first pair of source/drain regions 324 is formed in association with the first gate structure 304, and second pair of source/drain regions 326 are formed in association with the second gate structure 306.

Figure 3B:
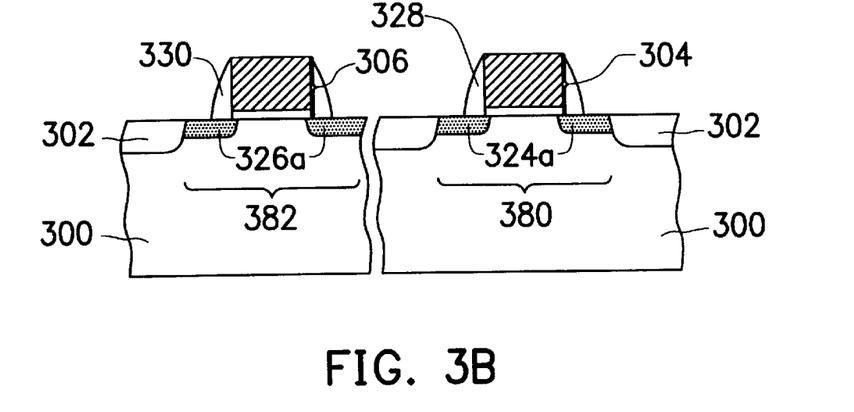

FIG. 3B, shows the subsequent step, in which an annealing process is performed on the wafer at a temperature of 900–1,000° C., whereby the impurities in the source/drain regions 324, 326 can be activated to diffuse evenly in the source/drain regions (hereinafter designated instead by the reference numeral 324a, 326a for distinguishing purpose). After this, sidewall spacers 328, 330 are formed respectively on the sidewalls of the gate structures 304, 306. The sidewall spacers 328, 330 can be formed, for example, first by performing a CVD process to deposit a layer of silicon nitride over the entire top surface of the wafer, and then by performing an etch-back process to remove unwanted portions of the silicon nitride layer. The remaining portions of the silicon nitride layer then serve as the sidewall spacers 328, 330.

The first gate structure 304 and the source/drain regions 324a in combination constitute a transfer FET 380 for the embedded DRAM device, while the second gate structure 306 and the source/drain regions 326a in combination constitute a logic circuit element 382 for the embedded DRAM device.

Figure 3C:
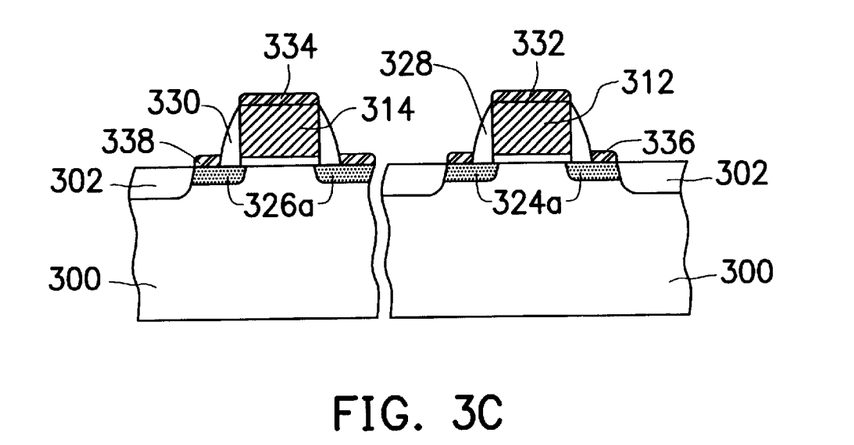

Referring next to FIG. 3C, in the subsequent step, a selective epitaxial growth (SEG) process is performed on the wafer at a temperature of 500–700° C. using gaseous $Si_2H_6$ as the gas source. As a result of this process, amorphous silicon layers 332, 334, 336, 338 are respectively formed over the exposed areas of the polysilicon layers 312, 314 and the source/drain regions 324a, 326a.

Figure 3D:
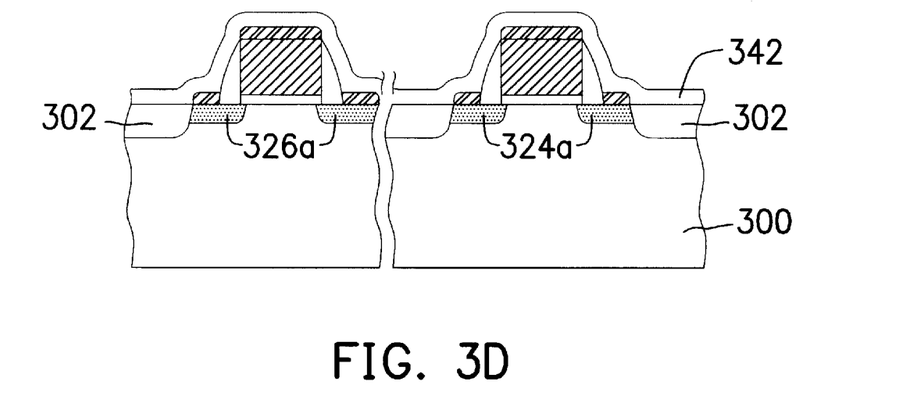

Referring further to FIG. 3D, in the subsequent step, a metal layer 342 is formed from a refractory metal such as titanium, tungsten, cobalt, nickel, platinum and palladium, and most preferably from titanium. In this preferred embodiment of the invention, titanium is selected to form the metal layer 342. In this case, a magnetically-controlled DC (direct current) sputtering process is performed to deposit a layer of titanium to a thickness of 200–1,000 Å to serve as the metal layer 342.

Figure 3E:
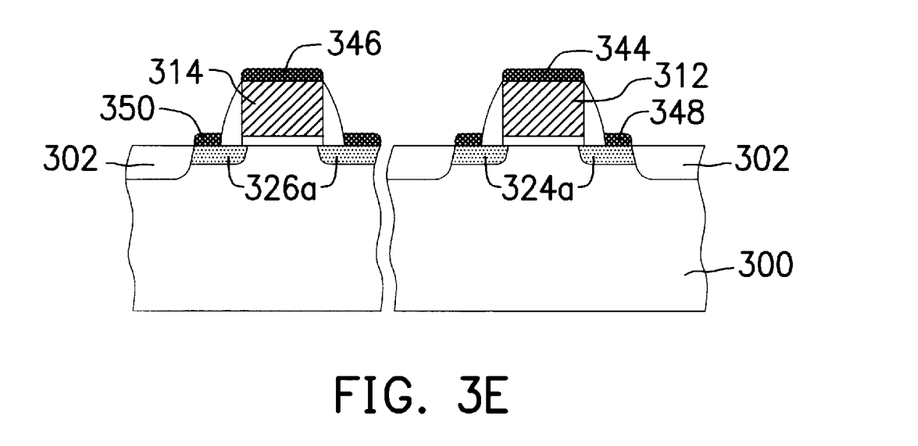

Referring further to FIG. 3E, in the subsequent step, an annealing process is performed on the wafer, preferably by a rapid thermal process (RTP) to rapidly heat the wafer to a temperature of about 700° C. for a continuous period of about 30 seconds. As a result of this process, those portions of the titanium metal layer 342 that are layered over the amorphous silicon layers 332, 334, 336, 338 are converted into titanium silicide layers with large granularity and high electrical resistance (i.e., the so-called C-49 stable phase titanium silicide layer). Next, a wet etching process is performed on the wafer by submerging the entire wafer in an aqueous solution of $H_2O_2$ and $NH_4OH$, in which the unreacted part of the titanium in the titanium metal layer 342 is removed. Through this process, the sidewall spacers 328, 330 are exposed. Subsequently, a second rapid annealing process is performed on the wafer at a temperature of above 750° C. for a continuous period of about 10 minutes. As a result of this process, the C-49 stable phase titanium silicide layers are converted into C-54 orthogonal titanium silicide layers, which are now designated instead by the reference numerals 344, 346, 348, and 350, respectively.

The method of invention is characterized in that the finished titanium silicide layers 344, 346, 348, and 350 are formed by first performing an SEG process to form the amorphous silicon layers 332, 334, 336, 338 respectively over the polysilicon layers 312, 314 and the source/drain regions 324a, 326a, and then performing a self-aligning silicide process on the amorphous silicon layers 332, 334, 336, 338. This allows the titanium silicide layers 348, 350 to be formed entirely over the source/drain regions 324a, 326a and thus be isolated from the substrate 300 by the source/drain regions 324a, 326a. As a benefit of this, the forming of the titanium silicide layers 348, 350 does not deplete part of the silicon atoms in the substrate 300 as in the case of the prior art. The method of the invention can thus prevent the drawback of a further thinning of the shallow junction that would otherwise occur in the embedded DRAM device fabricated by the method of the prior art.

Moreover, since by the method of the invention the titanium silicide layers 344, 346, 348, and 350 are formed after the activation of the impurities in the source/drain regions 324a, 326a, the inter-diffusion effect between the N-type polysilicon layer and the P-type polysilicon layer can be prevented when the method of the invention is used for the fabrication of an embedded DRAM device with dual-gate CMOS structure.

It should be also noted that the single FET shown in the left part of the wafer in FIGS. 3A–3F can be replaced by a CMOS structure that includes both NMOS transistors and PMOS transistors. The logic circuit element therefore has various embodiments.

Figure 3F:
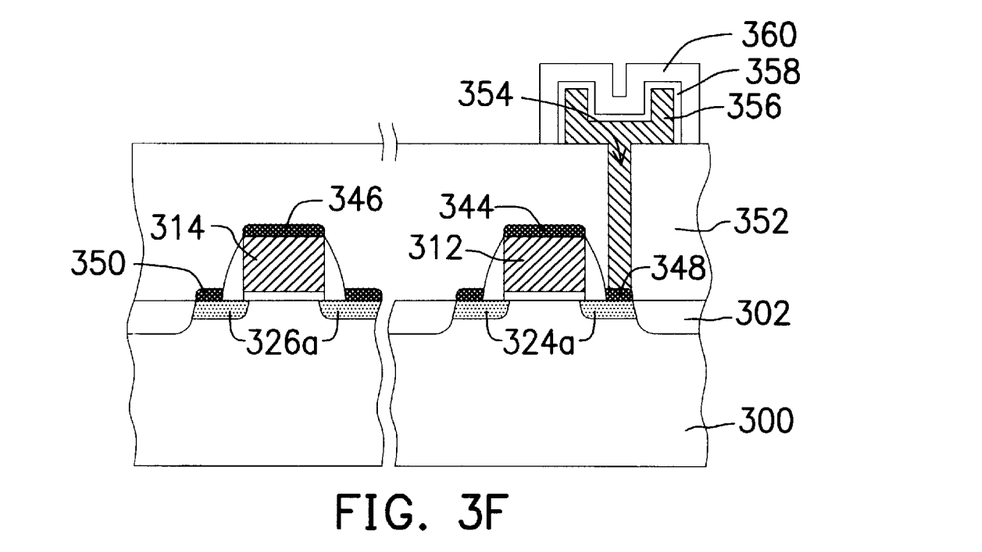

Referring finally to FIG. 3F, a dielectric layer 352 is then formed over the entire top surface of the wafer of FIG. 3E by, for example, first performing a CVD process to form a thick oxide layer over the entire top surface of the wafer, and then performing a CMP (chemical-mechanical polish) process for planarization of the oxide layer. The planarized oxide layer then serves as the dielectric layer 352. Next, a photolithographic and etching process is performed on the dielectric layer 352 at a selected location so as to form a contact window 354 through the dielectric layer 352 to expose the metal silicide layer 348 on one of the source/drain regions 324a of the transfer FET.

Subsequently, a first conductive layer 356 is formed over the dielectric layer 352 at a selected location above the contact window 354, with the first conductive layer 356 filling the contact window 354 such that the first conductive layer 356 comes into electrical contact with the metal silicide layer 348. Next, a dielectric layer 358 is formed over the first conductive layer 356, and then a second dielectric layer 360 is formed over the dielectric layer 358. The first and second conductive layers 356, 360 can be formed in a process such as performing a CVD process to deposit a polysilicon layer over the dielectric layer 352 and then performing an ion-implantation process to dope an impurity element into the polysilicon layer to increase its conductivity. The dielectric layer 358 can be formed from a material selected from the group consisting of silicon oxide, a combination of silicon nitride and silicon oxide (the so-called NO structure), a combination of silicon oxide, silicon nitride, and silicon oxide (the so-called ONO structure), $Ta_2O_3$, Pb (Zr, Ti)$O_3$ (also called PZT), and (Ba, Sr) $TiO_3$ (also called BST).

The method of the invention can also be used for the fabrication of an embedded DRAM device with dual-gate CMOS structure. In this case, since the silicide layers are formed after the activation of the impurities in the source/drain regions, it can help prevent the occurrence of the inter-diffusion effect between the N-type polysilicon layer and the P-type polysilicon layer in the dual-gate CMOS structure.

In conclusion, the method of the invention has the following advantages over the method of the prior art.

First, the method of the invention is characterized in that all the polysilicon gates and the associated source/drain regions of the transfer FET and the logic circuit FET in the embedded DRAM device are each overlaid with a metal silicide layer that can help increase the device's conductivity.

Second, the method of the invention is characterized in that the titanium silicide layers in the embedded DRAM device are formed by first performing an SEG process and then performing a self-aligning silicide process. This allows the titanium silicide layers to be formed entirely over the source/drain regions and thus isolated from the substrate by the source/drain regions. As a benefit of this, the forming of the titanium silicide layers does not deplete part of the silicon atoms in the substrate as in the prior art, thus preventing the drawback of the further thinning of the shallow junction that would otherwise occur in the embedded DRAM device fabricated by the prior art.

Third, when the method of the invention is used for the fabrication of an embedded DRAM device with dual-gate CMOS structure, it can help prevent the occurrence of inter-diffusion effect between the N-type polysilicon layer and the P-type polysilicon layer in the dual-gate CMOS structure.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an embedded DRAM device, the method comprising the steps of:

preparing a semiconductor substrate which is partitioned into a transfer field effect transistor (FET) area and a logic circuit area;

forming a first FET in the transfer FET area, the first FET including one polysilicon gate and one pair of associated source/drain regions;

forming a second FET in the logic circuit area, the second FET including one polysilicon gate and one pair of associated source/drain regions;

forming sidewall spacers on the sidewalls of the polysilicon gates of the first and second FETs;

performing a selective epitaxial growth process so as to form a plurality of amorphous silicon layers over the polysilicon gates and source/drain regions of the first and second FETs;

forming a metal layer over the entire top surface of the wafer;

performing an annealing process to allow the forming of a metal silicide layer from a reaction between the metal layer and each of the amorphous silicon layers, wherein the amorphous silicon layers are entirely used to form the metal silicide;

removing unreacted portions of the metal layer;

forming a dielectric layer over the entire top surface of the wafer; and forming a capacitive element over the dielectric layer, the capacitive element being electrically coupled to one of the source/drain regions of the first FET.

2. The method of claim 1, wherein the first and second source/drain regions are formed by the steps of:

performing an ion-implantation process so as to dope an impurity element into selected portions of the substrate; and performing an annealing process prior to the forming of the sidewall spacers, so as to activate the impurities doped in the first and second source/drain regions.

3. The method of claim 1, wherein the embedded DRAM device is of the type having a dual-gate CMOS structure.

4. The method of claim 2, wherein the embedded DRAM device is of the type having a dual-gate CMOS structure.

5. The method of claim 1, wherein the SEG process is performed at a temperature of 500–900° C.

6. The method of claim 1, wherein the metal layer is formed from a refractory metal.

7. The method of claim 6, wherein the metal layer is formed from titanium.

8. The method of claim 1, wherein the annealing process comprises a rapid thermal process.

9. The method of claim 7, wherein the annealing process is performed at a temperature of 700° C. for a continuous period of 30 seconds.

10. The method of claim 1, wherein the step (8) of removing the unreacted portion of the metal layer is carried out by performing a wet etching process, wherein the wafer is submerged in an aqueous solution of $H_2O_2$ and $NH_4OH$.

11. A method for fabricating an embedded DRAM device of the type having a dual-gate CMOS structure, the method comprising the steps of:

preparing a semiconductor substrate which is partitioned into a transfer field effect transistor (FET) area and a logic circuit area;

forming a first FET in the transfer FET area, the first FET including one polysilicon gate and one pair of associated source/drain regions;

forming a second FET in the logic circuit area, the second FET including one polysilicon gate and one pair of associated source/drain regions;

forming sidewall spacers on the sidewalls of the polysilicon gates of the first and second FETs;

performing a selective epitaxial growth process so as to form a plurality of amorphous silicon layers over the polysilicon gates and source/drain regions of the first and second FETs;

forming a metal layer over the entire top surface of the wafer;

performing an annealing process to allow the forming of a metal silicide layer from a reaction between the metal layer and each of the amorphous silicon layers, wherein the amorphous silicon layers are entirely used for forming the metal silicide;

removing unreacted portions of the metal layer;

forming a dielectric layer over the entire top surface of the wafer; and forming a capacitive element over the dielectric layer, the capacitive element being electrically coupled to one of the source/drain regions of the first FET.

12. The method of claim 11, wherein the first and second source/drain regions are formed by the steps of:

performing an ion-implantation process so as to dope an impurity element into selected portions of the substrate; and performing an annealing process prior to the forming of the sidewall spacers, so as to activate the impurities doped in the first and second source/drain regions.

13. The method of claim 11, wherein the SEG process is performed at a temperature of 500–900° C.

14. The method of claim 11, wherein the metal layer is formed from a refractory metal.

15. The method of claim 14, wherein the metal layer is formed from titanium.

16. The method of claim 11, wherein the annealing process comprises a rapid thermal process.

17. The method of claim 15, wherein the annealing process comprises a rapid thermal process.

18. The method of claim 11, wherein the step (8) of removing the unreacted portions of the metal layer is carried out by performing a wet etching process wherein the wafer is submerged in an aqueous solution of $H_2O_2$ and $NH_4OH$.

* * * * *